US009660002B2

(12) United States Patent
Tokuda et al.

(10) Patent No.: US 9,660,002 B2
(45) Date of Patent: May 23, 2017

(54) DISPLAY DEVICE

(71) Applicant: Japan Display Inc., Tokyo (JP)

(72) Inventors: Naoki Tokuda, Tokyo (JP); Yasuyuki Yamada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/975,641

(22) Filed: Dec. 18, 2015

(65) Prior Publication Data

US 2016/0181336 A1  Jun. 23, 2016

(30) Foreign Application Priority Data

Dec. 19, 2014 (JP) ................................. 2014-257112

(51) Int. Cl.
  *H01L 27/32* (2006.01)
  *H04N 9/30* (2006.01)
  *H01L 51/52* (2006.01)

(52) U.S. Cl.
  CPC ........ *H01L 27/322* (2013.01); *H01L 51/5284* (2013.01); *H04N 9/30* (2013.01)

(58) Field of Classification Search
  CPC ...... H01L 27/322; H01L 51/5284; H04N 9/30
  See application file for complete search history.

(56) References Cited

U.S. PATENT DOCUMENTS

| 2003/0146695 A1* | 8/2003 | Seki ..................... H01L 51/5284 313/506 |
| 2009/0295283 A1* | 12/2009 | Kim ...................... H01L 27/322 313/504 |
| 2010/0156279 A1* | 6/2010 | Tamura ............... H01L 27/3211 313/504 |
| 2015/0041813 A1* | 2/2015 | Kim ...................... H01L 27/124 257/59 |
| 2015/0090970 A1* | 4/2015 | Park ...................... H01L 27/322 257/40 |
| 2015/0236074 A1* | 8/2015 | Akagawa .............. H01L 27/322 257/40 |
| 2015/0311261 A1* | 10/2015 | Choi ..................... H01L 27/322 257/40 |

FOREIGN PATENT DOCUMENTS

JP    H08-84347 A    3/1996

* cited by examiner

*Primary Examiner* — Allan R Wilson
(74) *Attorney, Agent, or Firm* — Typha IP LLC

(57) ABSTRACT

A display device includes a pixel area. The plurality of pixels, each includes pixel electrodes; banks; an EL layer; a counter electrode; and a sealing substrate. The plurality of pixels each include a plurality of sub pixels demarcated by the banks; the sealing substrate includes red, blue and green color filters; the plurality of sub pixels each include an effective light emission area and a light-blocked area; the effective light emission area of the blue color filter has an area size larger than that of each of the effective light emission area of the red and green color filter; and an effective light emission area of one sub pixel adjacent to the sub pixel including the blue color filter is located at a position closest, in the one sub pixel, to the light-blocked area of the sub pixel including the blue color filter.

10 Claims, 8 Drawing Sheets

DISPLAY DEVICE

CROSS-REFERENCE TO RELATED APPLICATIONS

This application is based upon and claims the benefit of priority from the prior Japanese Patent Application No. 2014-257112, filed on Dec. 19, 2014, the entire contents of which are incorporated herein by reference.

FIELD

The present invention relates to a display device, and specifically, to a display device capable of suppressing refection of external light.

BACKGROUND

As a light emitting element using an electroluminescence phenomenon, an electroluminescence (hereinafter, referred to as "EL") element is known. An EL element is capable of emitting light of a color of any of various wavelengths in accordance with a light emitting material selected to form a light emitting layer, and is now applied more and more for a display device, an illumination device and the like. Especially, an organic EL element using an organic material as the light emitting material is now a target of attention.

An organic EL display device using an organic EL element includes the organic EL element acting as a light emitting element and a switching element that controls light emission performed by the EL element, in each of pixels located in a matrix on a substrate. The switching element is controlled to be on or off on a pixel-by-pixel basis, so that an arbitrary image is displayed on the entirety of a display area.

As a display form of an organic EL display device, two types of form, namely, a top emission type and a bottom emission type, are known. With a top emission type organic EL display device, light that is emitted by an organic EL element is reflected by a pixel electrode and output outside. With a bottom emission type organic EL display device, light that is emitted by an organic EL element is transmitted through the pixel electrode and output outside. Especially, the top emission type organic EL display device is advantageous in having a high numerical aperture of the pixels.

Conventionally with the top emission type organic EL display device, there are problems caused by the reflection of external light that the face of a viewer is seen on the screen and that the color is changed. In order to solve these problems, a circularly polarizing plate or the like is provided on an outermost surface of the display device to suppress the reflection of the external light. However, the provision of the circularly polarizing plate or the like on the outermost surface of the display device causes another problem that the luminance is decreased due to the presence of the circularly polarizing plate or the like.

These problems may be solved by adjusting the numerical apertures of red, green, blue and white pixels. Japanese Laid-Open Patent Publication No. Hei 8-84347 discloses a technology for forming the red, green and blue pixels with different area size ratios from each other. However, this technology is not proposed for the purpose of solving the problem that the external light is reflected by the outermost surface of a pixel electrode (anode) or a glass substrate, but is proposed for the purpose of allowing white color to be set freely in the state where liquid crystal cells are light-transmissive so as to enlarge the range of colors that are reproducible. As a measure to achieve this aim, the area size ratios of the red, green and blue pixels are made different from each other.

SUMMARY

A display device in an embodiment according to the present invention includes a pixel area in which a plurality of pixels are located in a matrix. The plurality of pixels each include pixel electrodes provided on a surface of an insulating layer; banks covering edges of the pixel electrodes and having openings on the pixel electrodes; an EL layer provided above the openings; a counter electrode provided to cover the EL layer; and a sealing substrate provided above the counter electrode. The plurality of pixels each include a plurality of sub pixels demarcated by the banks; the sealing substrate includes a red color filter, a blue color filter and a green color filter respectively included in the plurality of sub pixels; the plurality of sub pixels each include an effective light emission area not covered with a black matrix and a light-blocked area covered with the black matrix; the effective light emission area of the sub pixel including the blue color filter has an area size larger than that of each of the effective light emission area of the sub pixel including the red color filter and the effective light emission area of the sub pixel including the green color filter; and the effective light emission area of one sub pixel adjacent to the sub pixel including the blue color filter is located at a position closest, in the one sub pixel, to the light-blocked area of the sub pixel including the blue color filter.

The red color filter and the blue or green color filter may be located alternately in one of a direction parallel to data lines and a direction parallel to gate lines.

The area size of the effective light emission area of the sub pixel including the blue color filter may be at least 1.15 times the area size of each of the effective light emission area of the sub pixel including the red color filter and the effective light emission area of the sub pixel including the green color filter.

The light-blocked area may cover a contact hole.

As seen in a plan view, the pixel electrode positionally corresponding to the effective light emission area of the sub pixel including the red color filter may have substantially the same shape as that of the effective light emission area of the sub pixel including the red color filter, and the pixel electrode positionally corresponding to the effective light emission area of the sub pixel including the green color filter may have substantially the same shape as that of the effective light emission area of the sub pixel including the green color filter.

A display device in another embodiment according to the present invention includes a pixel area in which a plurality of pixels are located in a matrix. The plurality of pixels each include pixel electrodes provided on a surface of an insulating layer; banks covering edges of the pixel electrodes and having openings on the pixel electrodes; an EL layer provided above the openings; a counter electrode provided to cover the EL layer; and a sealing substrate provided above the counter electrode with a filler being provided between the sealing substrate and the counter electrode. The plurality of pixels each include a plurality of sub pixels; the sealing substrate includes a red color filter, a blue color filter, a white color filter and a green color filter respectively included in the plurality of sub pixels; the plurality of sub pixels each include an effective light emission area not covered with a black matrix and a light-blocked area covered with the black matrix; the effective light emission area of the sub pixel including the blue color filter has an area size larger than that of each of the effective light emission area of the sub pixel including the red color filter, the effective light emission area of the sub pixel including the white color filter and the effective light emission area of the sub pixel including the green color filter; and the effective light emission area of one sub pixel adjacent to the sub pixel including the blue color filter is located at a position closest, in the one sub pixel, to the light-blocked area of the sub pixel including the blue color filter.

The red or white color filter and the blue or green color filter may be located alternately in one of a direction parallel to data lines and a direction parallel to gate lines.

The area size of the effective light emission area of the sub pixel including the blue color filter may be at least 1.15 times the area size of each of the effective light emission area of the sub pixel including the red color filter and the effective light emission area of the sub pixel including the green color filter.

The light-blocked area may cover a contact hole.

As seen in a plan view, the pixel electrode positionally corresponding to the effective light emission area of the sub pixel including the red color filter may have substantially the same shape as that of the effective light emission area of the sub pixel including the red color filter, the pixel electrode positionally corresponding to the effective light emission area of the sub pixel including the white color filter may have substantially the same shape as that of the effective light emission area of the sub pixel including the white color filter, and the pixel electrode positionally corresponding to the effective light emission area of the sub pixel including the green color filter may have substantially the same shape as that of the effective light emission area of the sub pixel including the green color filter.

DESCRIPTION OF EMBODIMENTS

Figure 1:
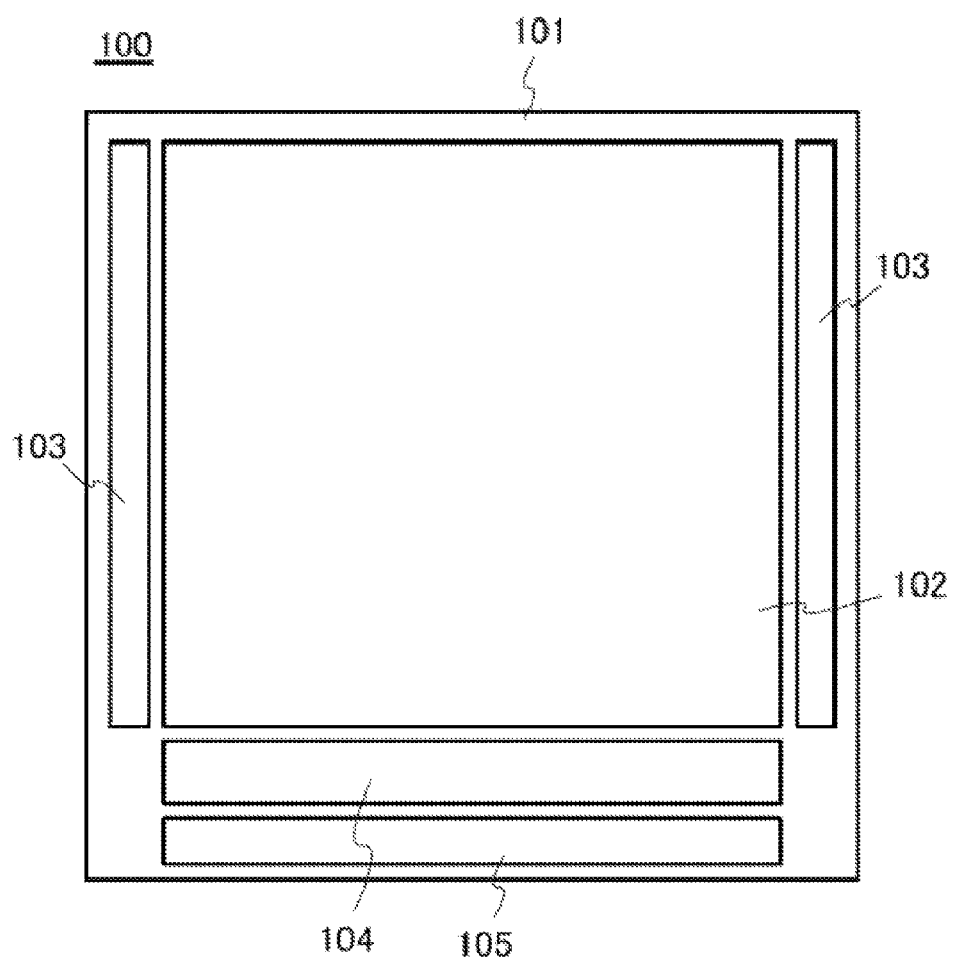
FIG. 1 shows an overall structure of a display device in embodiment 1 according to the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted.

A method for preventing reflection of external light at a pixel electrode (anode) or an outermost surface of a glass substrate without bonding a circularly polarizing plate or the like has been conventionally desired.

The present invention, in order to solve the above-described problems, has an object of providing a display device capable of suppressing reflection of external light without changing the conventionally used structure or material.

The present invention also has an object of providing a display device capable of suppressing decrease in the luminance.

Embodiment 1

With reference to FIG. 1 through FIG. 5, a structure of a display device 100 in embodiment 1 according to the present invention will be described.

FIG. 1 shows an overall structure of the display device 100 in embodiment 1 according to the present invention. The display device 100 includes a pixel area (display area) 102, a scanning line driving circuit 103, a data line driving circuit 104, and a driver IC 105, which are provided on a substrate 101. The driver IC 105 acts as a control unit that provides signals to the scanning line driving circuit 103 and the data line driving circuit 104.

In the example shown in FIG. 1, the driver IC 105 is formed integrally on the substrate 101. Alternatively, the driver IC 105 may be provided as an element separate from the substrate 101, for example, an IC chip and may be located on the substrate 101. Still alternatively, the driver IC 105 may be provided on a flexible printed circuit, and the flexible printed circuit may be attached to the substrate 101 as an external unit.

The pixel area 102 shown in FIG. 1 includes a plurality of pixels 201 (shown in FIG. 2) located in a matrix. The pixels 201 are each supplied with a data signal in accordance with image data from the data line driving circuit 104. The data signals are then supplied to corresponding pixel electrodes via switching elements provided in the respective pixels 201. Thus, an image in accordance with the image data is displayed. As the switching elements, thin film transistors are typically usable. The switching elements are not limited to the thin film transistors, and may be any elements having a switching function. Although not shown, gate lines extend in a row direction and connected with the scanning line driving circuit 103, and data lines extend in a column direction and connected with the data line driving circuit 104.

Figure 2:
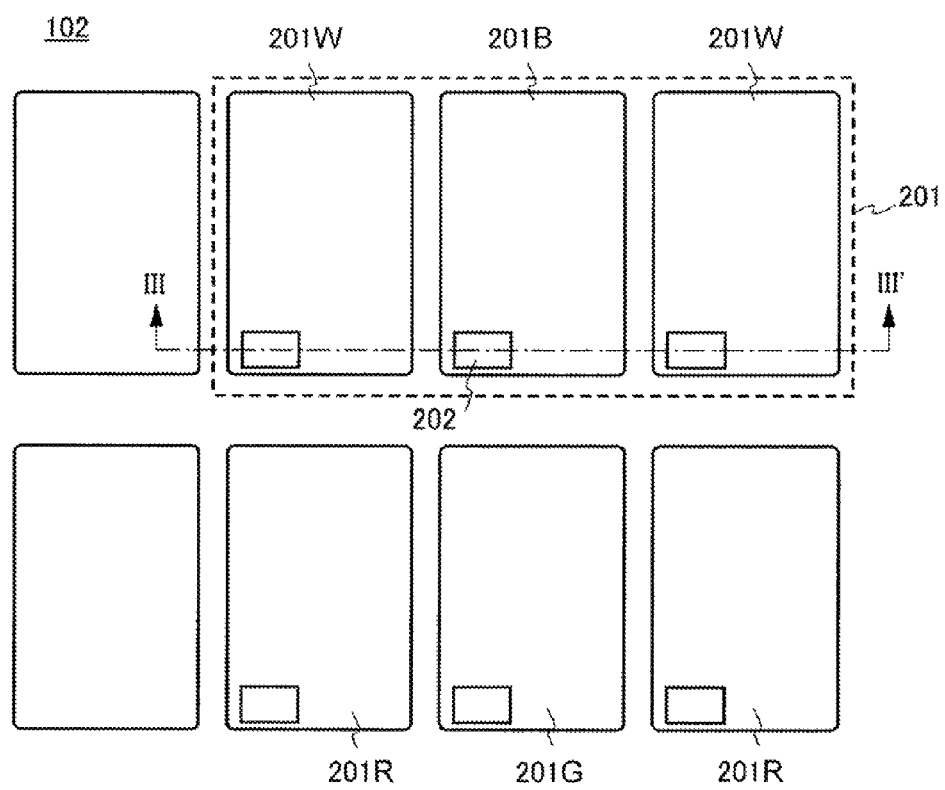
FIG. 2 shows a structure of a pixel area of the display device in embodiment 1 according to the present invention.

FIG. 2 shows a structure of the pixel area 102 of the display device 100 shown in FIG. 1. In this embodiment, the pixels 201 each include a sub pixel 201R corresponding to red (R), a sub pixel 201G corresponding to green (G), a sub pixel 201B corresponding to blue (B), and a sub pixel 201W corresponding to white (W). Each of the sub pixels includes a thin film transistor 202 as a switching element. The thin film transistor 202 is used to control the corresponding sub pixel 201R, 201G, 201B or 202W to be on or off, so that light of an arbitrary color corresponding to each sub pixel is emitted. Thus, the pixel 201 provides any of various colors.

In the example shown in FIG. 2, the sub pixels correspond to four colors of RGBW. The display device 100 in this embodiment is not limited to having such a structure, and the pixel 201 may include three sub pixels corresponding to the three primary colors of RGB, or four sub pixels corresponding to the RGB colors and yellow (Y). The shape or the positional arrangement of the sub pixels will be described later.

Figure 3:
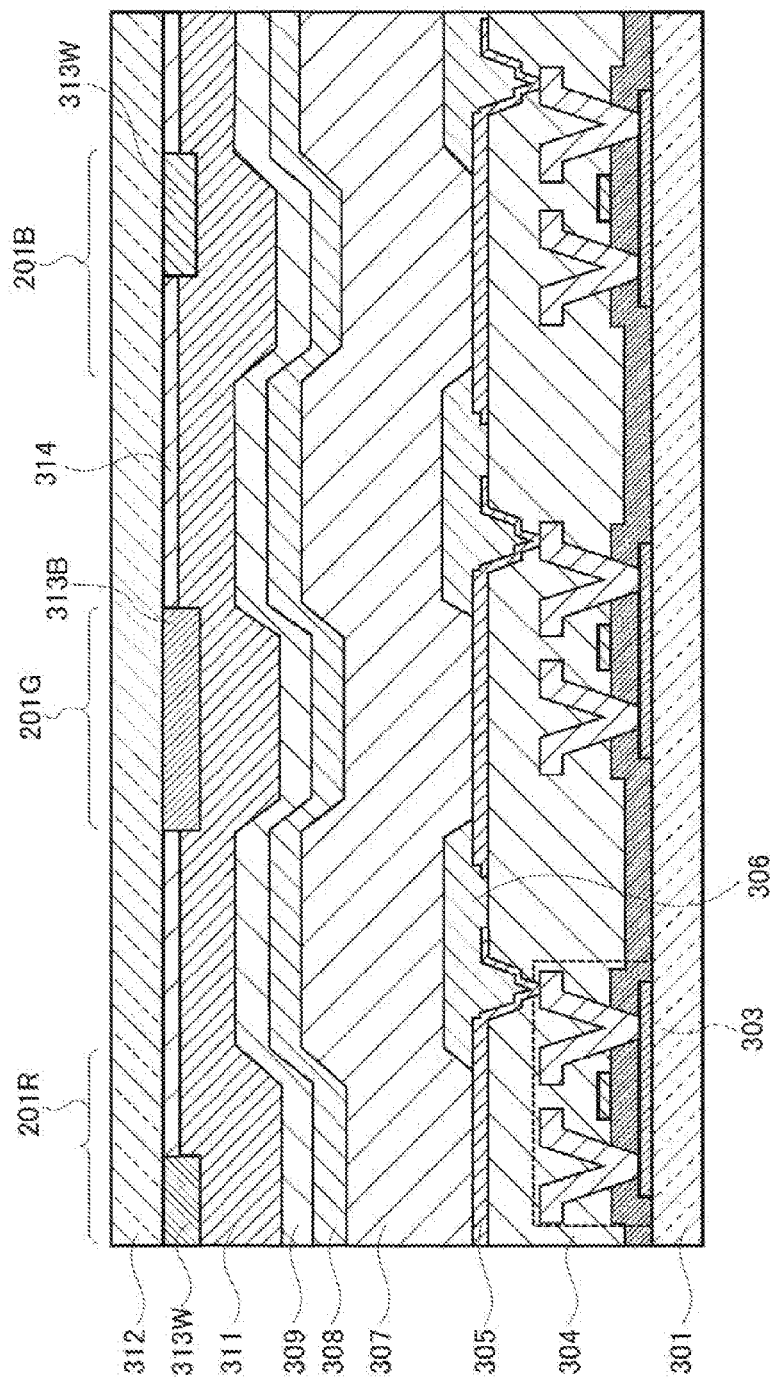
FIG. 3 shows a cross-sectional structure of the pixel area in the display device in embodiment 1 according to the present invention, taken along line III-III' in FIG. 2.

FIG. 3 shows a cross-sectional structure of the pixel 201 shown in FIG. 2 taken along line III-III' in FIG. 2.

As shown in FIG. 3, thin film transistors 303 are provided on a first substrate 301.

The first substrate 301 may be a glass substrate, a quartz substrate, or a flexible substrate (formed of a bendable material such as polyimide, polyethyleneterephtalate, polyethylenenaphthalate or the like). In the case where the first substrate 301 does not need to be light-transmissive, the first substrate 301 may alternatively be a metal substrate, a ceramic substrate or a semiconductor substrate.

The thin film transistors 303 may be formed by a known method. The thin film transistors 303 may be of a top gate type or a bottom gate type. The display device 100 in this embodiment has a structure in which a first insulating layer 304 is provided so as to cover the thin film transistors 303, more specifically, so as to cover a convexed and concaved surface of the thin film transistors 303 and to provide a flat surface. The first insulating layer 304 is preferably formed of a resin material. For example, the first insulating layer 304 may be formed of a known organic material such as polyimide, polyamide, acrylic resin, epoxy or the like. Alternatively, the first insulating layer 304 may be formed of an inorganic material such as silicon oxide or the like, instead of an organic material, or may have a stack structure of an organic film and an inorganic film, as long as the flattening effect is provided.

On the first insulating layer 304, pixel electrodes 305 are provided. The pixel electrodes 305 are respectively connected with the thin film transistors 303 via contact holes formed in the first insulating layer 304. In the display device 100 in this embodiment, the pixel electrodes 305 each act as an anode of an organic EL element.

The pixel electrodes 305 have a different structure in the case where the display device 100 is of the top emission type from in the case where the display device 100 is of the bottom emission type. In the case where, for example, the display device 100 is of the top emission type, the pixel electrodes 305 may each be formed of a metal film having a high reflectance or may each have a stack structure of a metal film and a transparent conductive film formed of a material having a high work function, for example, an indium oxide-based transparent material or a zinc oxide-based transparent material. In the case where the display device 100 is of the bottom emission type, the pixel electrodes 305 may each be formed of a transparent conductive film as described above. In this embodiment, the display device 100 of the top emission type will be described as an example.

As shown in FIG. 3, a bank 306 is provided over each two adjacent pixel electrodes 305. More specifically, the banks 306 are each provided so as to cover edges of each two adjacent pixel electrodes 305. The banks 306 are also provided so as to have openings at positions on the pixel electrodes 305. As a result, the banks 306 act as members that demarcate the sub pixels. The banks 306 may each act as a filler that fills a recessed portion caused by the contact hole in addition to covering the edges of the pixel electrodes 305.

In this embodiment, the banks 306 may be formed of a known resin material, for example, a polyimide-based, a polyamide-based, an acrylic-based, an epoxy-based or a siloxane-based resin. The banks 306 are not limited to being shaped as shown in FIG. 3. A cross-section of each bank 306 including an apex thereof (cross-section taken along a plane vertical to a surface of the pixel electrode 305) may have a curved profile, or may have any other shape.

On the pixel electrodes 305 and the banks 306, an electroluminescence layer (EL layer) 307 is provided. The EL layer 307 includes at least a light emitting layer and acts as a light emitting unit of the organic EL element. The EL layer 307 may include various functional layers such as an electron injection layer, an electron transfer layer, a hole injection layer and a hole transfer layer, in addition to the light emitting layer. These layers are formed of an organic material having a low molecular weight or high molecular weight. The light emitting layer may be formed of electroluminescence type quantum dots instead of an organic material.

In this embodiment, the EL layer 307 emits white light, and color separation is performed by use of color filters described later. The EL layer 307 that emits white light may include, for example, a combination of a light emitting layer that emits blue light and a light emitting layer that emits yellow light. Alternatively, the EL layer 307 may have any other known structure or may use any other known material, and is not limited to having any specific structure or to using any specific material.

On the EL layer 307, a common electrode 308 (counter electrode) acting as a cathode of the organic EL element is provided. Since the display device 100 in this embodiment is of the top emission type, the common electrode 308 may be formed of an MgAg thin film or a transparent conductive film (ITO film or IZO film). The common electrode 308 is provided in the entirety of the pixel area 102 over the pixels 201. On the common electrode 308, an assisting line (not shown) may be provided.

Above the common electrode 308, a sealing substrate is provided. Between the sealing substrate and the common electrode 308, a sealing film 309 acting as an adhesive and a protective film and a filler 311 are provided. The filler 311 may be formed of a known resin material, for example, a polyimide-based, a polyamide-based, an acrylic-based, an epoxy-based or a siloxane-based resin.

In this embodiment, the "sealing substrate" includes a second substrate 312, color filters 313R, 313G, 313B and 313W, respectively corresponding to the RGBW colors, provided on a main surface of the second substrate 312 (surface facing the first substrate 301), and a black matrix 314 provided in gaps between the color filters 313R, 313G, 313B and 313W. (In FIG. 3, only the color filters 313B and 313W are shown.)

The sealing substrate is not limited to having such a structure. The color filters 313R, 313G, 313B and 313W may be omitted in the case where the EL layer 307 includes areas respectively corresponding to the RGBW colors.

Figure 4:
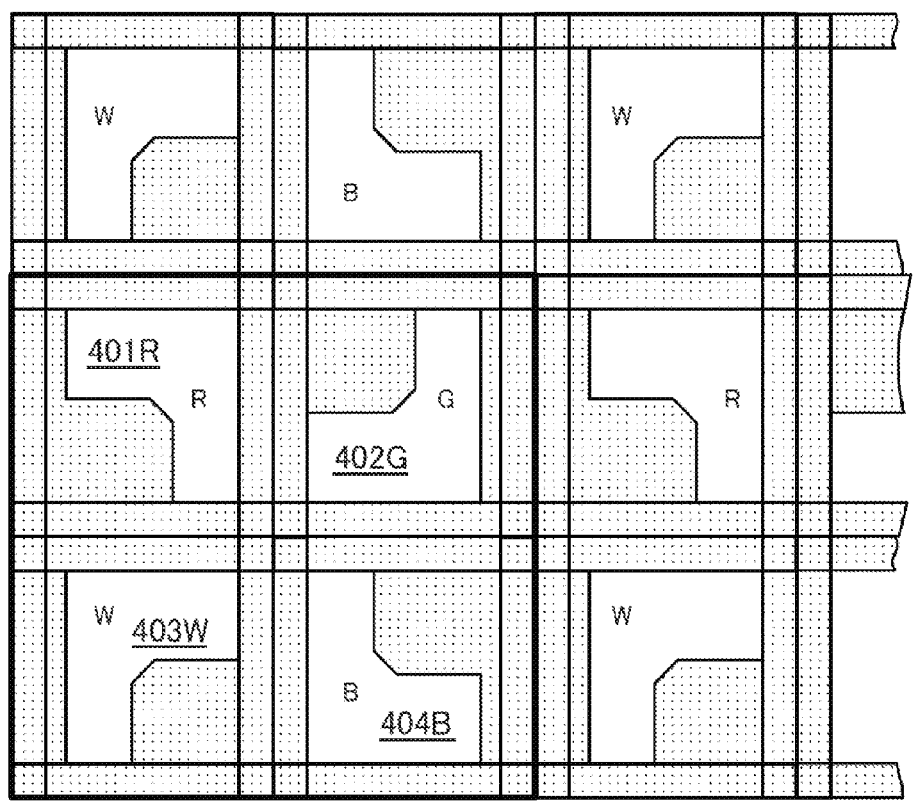
FIG. 4 shows shapes of color filters in a conventional pixel area.

FIG. 4 shows shapes of color filters in a conventional pixel area.

Referring to FIG. 4, in the conventional pixel area, an effective light emission area 401R of a color filter for red (red color filter), an effective light emission area 402G of a color filter for green (green color filter), an effective light emission area 403W of a color filter for white (white color filter), and an effective light emission area 404B of a color filter for blue (blue color filter) have substantially the same shape with each other. In this specification, the "effective light emission area" refers to an area that is not covered with the black matrix in each of the sub pixels demarcated by the edges of the openings (i.e., area effectively acting as a light emission area on the screen).

In such a conventional pixel area, the effective light emission area 403W of the white color filter, which has a high transmittance, and the effective light emission area 401R of the red color filter, which has an adverse influence on the hue of reflected light, each have substantially the same area size as that of each of the effective light emission area 402G of the green color filter and the effective light emission area 404B of the blue color filter. Therefore, in order to suppress external light from being reflected by the reflective electrode, a circularly polarizing plate or the like needs to be bonded.

Figure 5:
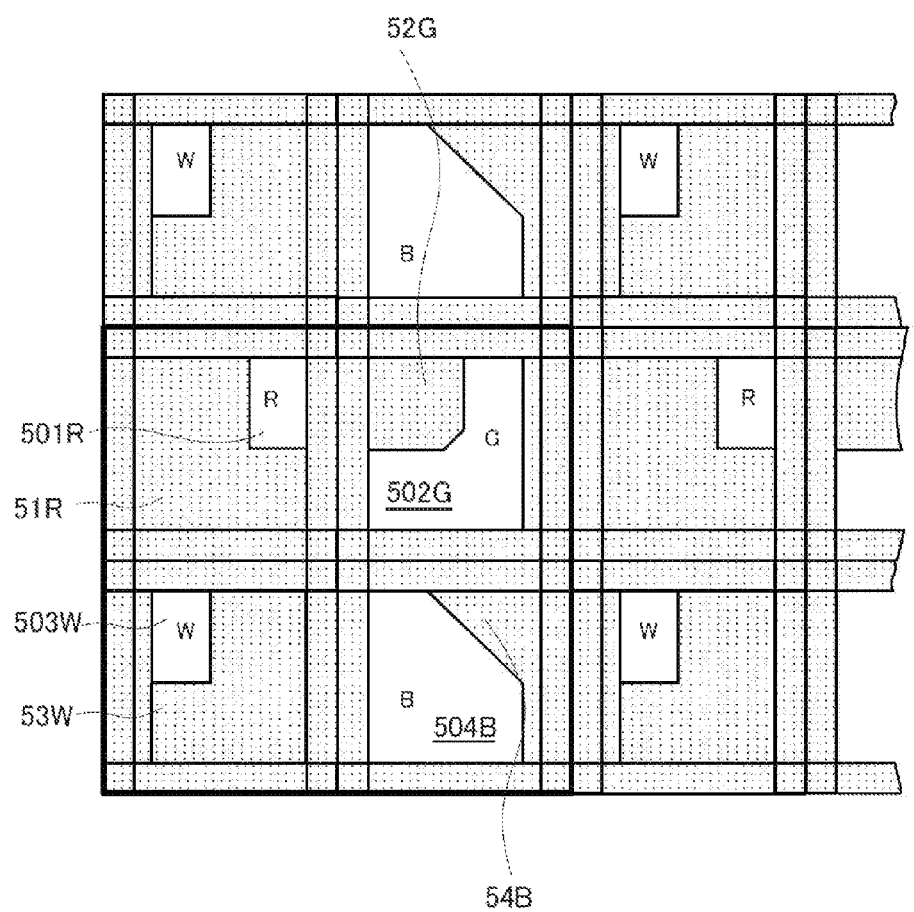
FIG. 5 shows a shape of each of color filters in the pixel area of the display device in embodiment 1 according to the present invention.

FIG. 5 shows shapes of color filters in the pixel area of the display device 100 in embodiment 1 according to the present invention.

Referring to FIG. 5, in the pixel area of the display device 100 in embodiment 1 according to the present invention, the color filters for different colors have different shapes. Specifically, an effective light emission area 503W of the white color filter, which has a high transmittance, and an effective light emission area 501R of the red color filter, which has an adverse influence on the hue of reflected light, have a small area size, whereas an effective light emission area 504B of the blue color filter, which has a low transmittance, has a large area size.

The red or white color filters and the blue or green color filters may be located alternately in one of a direction parallel to the data lines and a direction parallel to the gate lines.

As described above, an object of the present invention is achieved in the case where the effective light emission area 504B of the blue color filter is formed to have a larger area size than that of each of the effective light emission area 501R of the red color filter and the effective light emission area 502G of the green color filter. It is preferable that the area size of the effective light emission area 504B of the blue color filter is at least 1.15 times the area size of each of the effective light emission area 501R of the red color filter and the effective light emission area 502G of the green color filter. In this case, the external light is prevented from being reflected by the pixel electrode (anode) or the outermost surface of the glass substrate.

In the display device 100 in embodiment 1 according to the present invention, the area size of the effective light emission area 502G of the green color filter is smaller than the area size of the effective light emission area 504B of the blue color filter and is larger than the area size of each of the effective light emission area 503W of the white color filter and the effective light emission area 501R of the red color filter. The display device 100 is not limited to having such a structure. Alternatively, the area size of the effective light emission area 502G of the green color filter may be substantially the same as the area size of the effective light emission area 503W of the white color filter or the area size of the effective light emission area 501R of the red color filter, or may be substantially the same as the area size of the effective light emission area 504B of the blue color filter.

In embodiment 1 according to the present invention, the effective light emission area 504B of the blue color filter is not limited to having the shape shown in FIG. 5, and may be trapezoidal, may extend to the vicinity of the edge of the contact hole as long as the black matrix covers the contact hole, or may extend over the entirety of the pixel area enclosed by the gate line and the data line.

The effective light emission area 501R of the red color filter, the effective light emission area 503W of the white color filter and the effective light emission area 502G of the green color filter each have a small area size as described above. The pixel electrodes and the openings of the banks positionally corresponding to these color filters may be formed to be small in accordance with the area size of the effective light emission areas thereof. For example, as seen in a plan view, the pixel electrode positionally corresponding to the effective light emission area 501R of the sub pixel including the red color filter has substantially the same shape as that of the effective light emission area 501R, the pixel electrode positionally corresponding to the effective light emission area 503W of the sub pixel including the white color filter has substantially the same shape as that of the effective light emission area 503W, and the pixel electrode positionally corresponding to the effective light emission area 502G of the sub pixel including the green color filter has substantially the same shape as that of the effective light emission area 502G. In the following description, the sub pixel including the red color filter will be referred to as a "red sub pixel", the sub pixel including the green color filter will be referred to as a "green sub pixel", the sub pixel including the blue color filter will be referred to as a "blue sub pixel", and the sub pixel including the white color filter will be referred to as a "white sub pixel".

In the display device 100 in embodiment 1 according to the present invention, the area sizes of the effective light emission areas of the colors filters are set as described above. More specifically, the area size of the effective light emission area 504B of the blue color filter, which has the lowest transmittance among the four types of color filters and thus restricts the luminance, is made larger while the luminance of the entire pixel area is decreased. In this manner, the hue of the external light reflected by the outermost surface of the glass substrate is made bluish. As a result, the intensity of the reflected external light is decreased while the luminance is prevented from being decreased.

Further referring FIG. 5, in embodiment 1 according to the present invention, the effective light emission areas of the color filters are positionally arranged so as to be different in the shape or the orientation (direction of the longer side or the shorter side) between two adjacent sub pixels. Specifically, the effective light emission area of the white or red color filter is located at a position closest, in the white or red sub pixel, to a light-blocked area of the blue or green sub pixel adjacent thereto. In other words, the effective light emission area of the white or red color filter is located to face the light-blocked area of the blue or green sub pixel adjacent thereto, with data lines being located therebetween.

This will be described more specifically. Referring to FIG. 5, for example, to the sub pixel in the bottom row and the right column, the effective light emission area 503W of the white color filter is located at a position closest, in the white sub pixel, to a light-blocked area 54B of the blue sub pixel adjacent thereto. Similarly, referring to the sub pixel in the middle row and the left column, the effective light emission area 501R of the red color filter is located at a position closest, in the red sub pixel, to a light-blocked area 52G of the green sub pixel adjacent thereto. In this specification, the "light-blocked area" refers to an area covered with the black matrix in each of sub pixels demarcated by the edges of the banks (i.e., an area in which the pixel electrode exposed to the opening of the bank is overlapped by the black matrix). The light-blocked area may cover the contact hole.

In this embodiment, the color filters of the sub pixels are not limited to being shaped or positionally arranged as shown in FIG. 5. The color filters may have any other shape and may be positionally arranged in any other manner as long as the effective light emission area of the white or red color filter is located at a position closest, in the white or red sub pixel, to the light-blocked area of the blue or green sub pixel adjacent thereto.

In the display device 100 in embodiment 1 according to the present invention, the sub pixels are shaped and positionally arranged as described above. Thus, the effective light emission areas of the color filters of two adjacent sub pixels are located such that light in one sub pixel does not easily leak to the other sub pixel. Therefore, light emitted from the light emitting layer of one sub pixel is prevented from being directed toward an adjacent sub pixel, and thus color mixing between such adjacent sub pixels is suppressed.

Embodiment 2

Figure 6A:
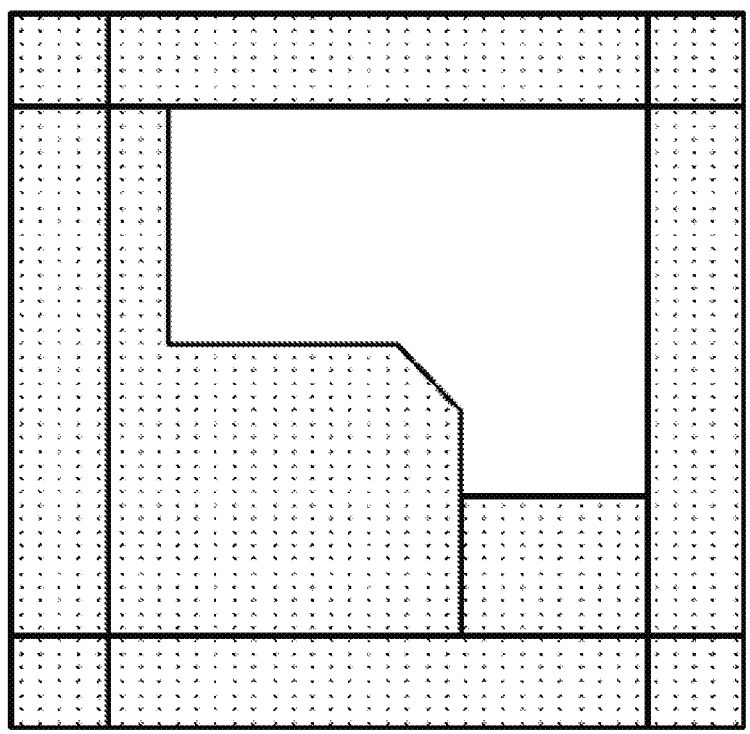
FIG. 6A shows a shape of a color filter in a pixel area of a display device in another embodiment according to the present invention.
Figure 6B:
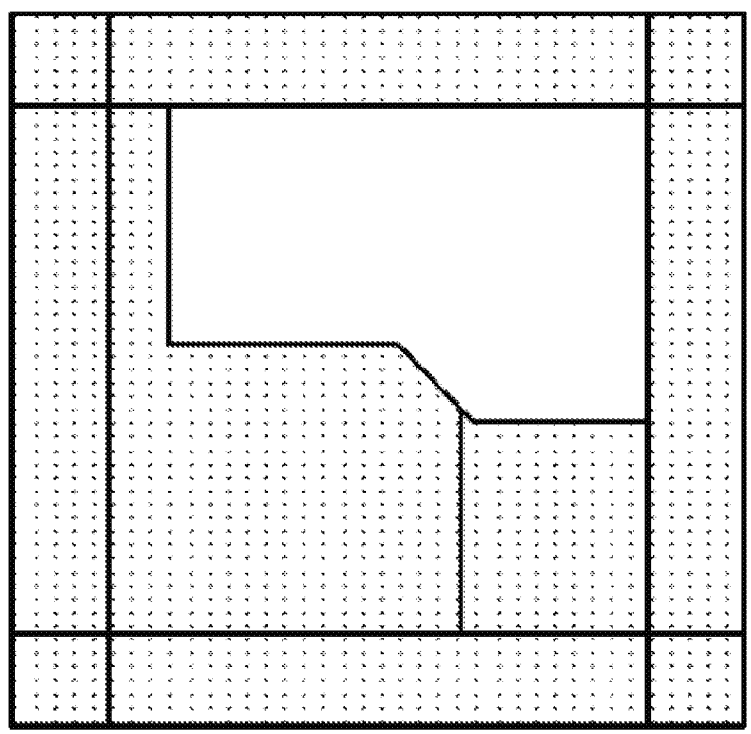
FIG. 6B shows a shape of a color filter in the pixel area of the display device in the another embodiment according to the present invention.
Figure 6C:
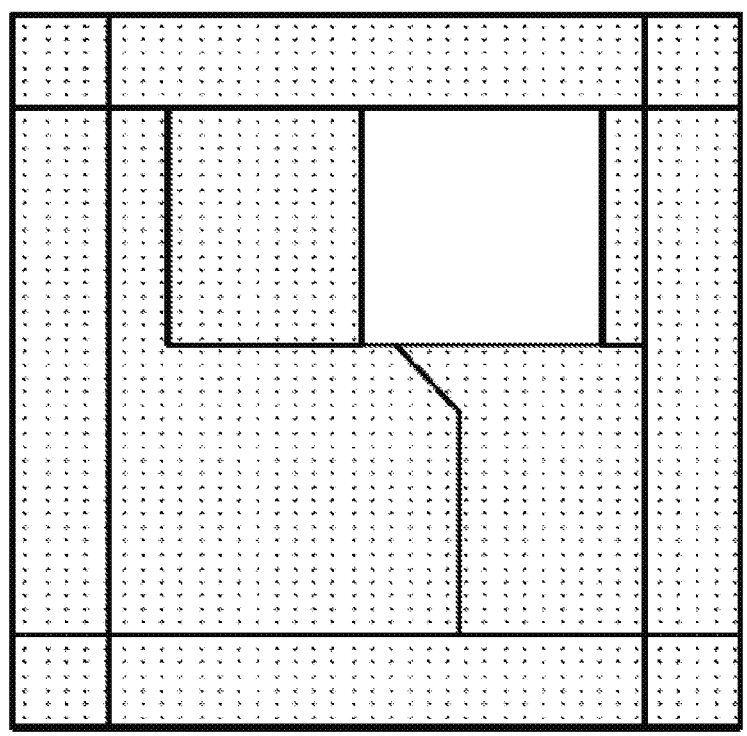
FIG. 6C shows a shape of a color filter in the pixel area of the display device in the another embodiment according to the present invention.

FIG. 6A, FIG. 6B and FIG. 6C each show a shape of a color filter in a pixel area in embodiment 2 according to the present invention.

In embodiment 2 according to the present invention, the effective light emission area of a green color filter may be shaped as shown in FIG. 6A or FIG. 6B. The effective light emission area of a red or white color filter may be square as shown in FIG. 6C.

The present invention is not limited to any of the above-described embodiments, and the embodiments may be modified appropriately without departing from the gist of the present invention.

What is claimed is:
1. A display device, comprising:
a plurality of pixels located in a matrix each including:
pixel electrodes provided on a surface of an insulating layer;
banks covering edges of the pixel electrodes and having openings on the pixel electrodes;
an EL layer provided above the openings;
a counter electrode provided to cover the EL layer; and
a sealing substrate provided above the counter electrode;
wherein:
the plurality of pixels each include a plurality of sub pixels demarcated by the banks;
the sealing substrate includes a red color filter, a blue color filter and a green color filter respectively included in the plurality of sub pixels;
the plurality of sub pixels each include an effective light emission area not covered with a black matrix and a light-blocked area covered with the black matrix;
the effective light emission area of the sub pixel including the blue color filter has an area size larger than that of each of the effective light emission area of the sub pixel including the red color filter and the effective light emission area of the sub pixel including the green color filter;
the effective light emission area of one sub pixel adjacent to the sub pixel including the blue color filter is located at a position closest to the light-blocked area of the sub pixel including the blue color filter, in plan view; and
two sub pixels of the plurality of sub pixels are each immediately adjacent in a horizontal direction to a side of the sub pixel including the blue color filter, the two sub pixels each including a white color filter.

2. The display device according to claim 1, wherein the red color filter and the blue or green color filter are located alternately in one of a direction parallel to data lines and a direction parallel to gate lines.

3. The display device according to claim 1, wherein the area size of the effective light emission area of the sub pixel including the blue color filter is at least 1.15 times the area size of each of the effective light emission area of the sub pixel including the red color filter and the effective light emission area of the sub pixel including the green color filter.

4. The display device according to claim 1, wherein the light-blocked area covers a contact hole.

5. The display device according to claim 1, wherein as seen in a plan view, the pixel electrode positionally corresponding to the effective light emission area of the sub pixel including the red color filter has substantially the same shape as that of the effective light emission area of the sub pixel including the red color filter, and the pixel electrode positionally corresponding to the effective light emission area of the sub pixel including the green color filter has substantially the same shape as that of the effective light emission area of the sub pixel including the green color filter.

6. A display device, comprising:
a plurality of pixels located in a matrix each including:
pixel electrodes provided on a surface of an insulating layer;
banks covering edges of the pixel electrodes and having openings on the pixel electrodes;
an EL layer provided above the openings;
a counter electrode provided to cover the EL layer; and
a sealing substrate provided above the counter electrode with a filler being provided between the sealing substrate and the counter electrode;
wherein:
the plurality of pixels each include a plurality of sub pixels;
the sealing substrate includes a red color filter, a blue color filter, a white color filter and a green color filter respectively included in the plurality of sub pixels;
the plurality of sub pixels each include an effective light emission area not covered with a black matrix and a light-blocked area covered with the black matrix;
the effective light emission area of the sub pixel including the blue color filter has an area size larger than that of each of the effective light emission area of the sub pixel including the red color filter, the effective light emission area of the sub pixel including the white color filter and the effective light emission area of the sub pixel including the green color filter;
the effective light emission area of one sub pixel adjacent to the sub pixel including the blue color filter is located at a position closest to the light-blocked area of the sub pixel including the blue color filter, in plan view; and
two sub pixels of the plurality of sub pixels are each immediately adjacent in a horizontal direction to a side of the sub pixel including the blue color filter, the two sub pixels each including a white color filter.

7. The display device according to claim 6, wherein the red or white color filter and the blue or green color filter are located alternately in one of a direction parallel to data lines and a direction parallel to gate lines.

8. The display device according to claim 6, wherein the area size of the effective light emission area of the sub pixel including the blue color filter is at least 1.15 times the area size of each of the effective light emission area of the sub pixel including the red color filter and the effective light emission area of the sub pixel including the green color filter.

9. The display device according to claim 6, wherein the light-blocked area covers a contact hole.

10. The display device according to claim 6, wherein as seen in a plan view, the pixel electrode positionally corresponding to the effective light emission area of the sub pixel including the red color filter has substantially the same shape as that of the effective light emission area of the sub pixel including the red color filter, the pixel electrode positionally corresponding to the effective light emission area of the sub pixel including the white color filter has substantially the same shape as that of the effective light emission area of the sub pixel including the white color filter, and the pixel electrode positionally corresponding to the effective light emission area of the sub pixel including the green color filter has substantially the same shape as that of the effective light emission area of the sub pixel including the green color filter.

* * * * *